United States Patent
Hernandez et al.

(10) Patent No.: US 11,973,276 B2
(45) Date of Patent: Apr. 30, 2024

(54) CONTACTLESS COMMUNICATION ANTENNA FOR COMMUNICATION TERMINAL

(71) Applicant: BANKS AND ACQUIRERS INTERNATIONAL HOLDING, Paris (FR)

(72) Inventors: Vincent Hernandez, Claveyson (FR); Jérôme Andre, Montoison (FR)

(73) Assignee: BANKS AND ACQUIRERS INTERNATIONAL HOLDING, Paris (FR)

( * ) Notice: Subject to any disclaimer, the term of this patent is extended or adjusted under 35 U.S.C. 154(b) by 316 days.

(21) Appl. No.: 17/425,842

(22) PCT Filed: Jan. 28, 2020

(86) PCT No.: PCT/EP2020/052070
§ 371 (c)(1),
(2) Date: Jul. 26, 2021

(87) PCT Pub. No.: WO2020/157082
PCT Pub. Date: Aug. 6, 2020

(65) Prior Publication Data
US 2022/0173513 A1 Jun. 2, 2022

(30) Foreign Application Priority Data
Jan. 29, 2019 (FR) ...................................... 1900781

(51) Int. Cl.
*H01Q 7/00* (2006.01)
*H01Q 1/38* (2006.01)
(Continued)

(52) U.S. Cl.
CPC ................. *H01Q 7/00* (2013.01); *H01Q 1/38* (2013.01); *H01R 12/78* (2013.01); *H05K 1/028* (2013.01)

(58) Field of Classification Search
CPC ............ H01Q 7/00; H01Q 1/38; H01R 12/78; H01R 2201/02; H05K 1/028; H05K 1/118; H05K 2201/055; H05K 2201/10098
See application file for complete search history.

(56) References Cited

U.S. PATENT DOCUMENTS 9,226,393 B2  12/2015  Steffen et al.
10,446,932 B2  10/2019  Andre et al.
(Continued)

FOREIGN PATENT DOCUMENTS

EP  3107149 A1  12/2016
EP  3300260 A2  3/2018
(Continued)

OTHER PUBLICATIONS

International Preliminary Report on Patentability and English translation of the Written Opinion dated Jul. 27, 2021 for corresponding International Application No. PCT/EP2020/052070, Jan. 28, 2020.
(Continued)

*Primary Examiner* — David E Lotter
(74) *Attorney, Agent, or Firm* — David D. Brush; Westman, Champlin & Koehler, P.A.

(57) ABSTRACT

A flexible printed circuit including at least two conductive tracks extending along the length of the flexible printed circuit. The conductive tracks form at least two antenna loops. The at least two conductive tracks are substantially parallel to one another. A contact zone located at a first end of the flexible printed circuit is configured to contact a predetermined portion of the flexible printed circuit so that a first track of the flexible printed circuit is connected with
(Continued)

a second track of the flexible printed circuit when the first end is placed in contact with the predetermined portion.

16 Claims, 4 Drawing Sheets

(51) Int. Cl.
   *H01R 12/78* (2011.01)
   *H05K 1/02* (2006.01)

(56) References Cited

U.S. PATENT DOCUMENTS

| | | | |
|---|---|---|---|
| 10,749,573 | B2 | 8/2020 | Pavageau |
| 2010/0190528 | A1 | 7/2010 | Hsiao et al. |
| 2016/0372829 | A1* | 12/2016 | Andre ................... H01Q 1/38 |
| 2018/0317324 | A1* | 11/2018 | Yonemori ............. H05K 1/189 |
| 2020/0153482 | A1 | 5/2020 | Pavageau |

FOREIGN PATENT DOCUMENTS

| | | |
|---|---|---|
| EP | 3300260 A3 | 5/2018 |
| FR | 3065119 A1 | 10/2018 |
| WO | 2018033748 A1 | 2/2018 |

OTHER PUBLICATIONS

International Search Report dated Mar. 26, 2020 for corresponding International Application No. PCT/EP2020/052070, Jan. 28, 2020.
Written Opinion of the International Searching Authority dated Mar. 26, 2020 for corresponding International Application No. PCT/EP2020/052070, filed Jan. 28, 2020.

* cited by examiner

CONTACTLESS COMMUNICATION ANTENNA FOR COMMUNICATION TERMINAL

1. CROSS-REFERENCE TO RELATED APPLICATIONS

This Application is a Section 371 National Stage Application of International Application No. PCT/EP2020/052070, filed Jan. 28, 2020, the content of which is incorporated herein by reference in its entirety, and published as WO 2020/157082 on Aug. 6, 2020, not in English.

2. FIELD OF THE INVENTION

The invention relates to the field of communication antennas. More particularly, the invention relates to the field of communication antennas for portable devices, such as user terminals or payment terminals.

3. PRIOR ART

User terminals, such as smartphones, tablets but also payment terminals integrate various techniques for wirelessly receiving and transmitting data: UMTS, GSM, WIFI, Bluetooth, NFC. These techniques require the implementation of transceivers and antennas. The transceivers are often in the form of chips that are placed on a printed circuit board (PCB). Some transceiver chips are multi-standard chips. This means that they support a plurality of data transmission techniques. To be able to function correctly, a transceiver chip is particularly connected to an antenna. The antenna is a device making it possible to radiate (transmitter) or, pick up (receiver), electromagnetic waves.

One of the techniques the most recently integrated within user terminals is a contactless reading technique. This concerns for example a Near-Field Communication (NFC) technique. Near-field communication (NFC) is a high-frequency, short-range, wireless communication technology that makes it possible to exchange data between two compatible devices at a maximum distance in the order of around ten centimetres. This concerns a connection extension of the standard that defines proximity cards using radio frequency identification (RFID), which combine the interface of a smart card and a reader within a single peripheral.

The implementation of this data transmission technology within terminals is not without posing a few problems, particularly integration problems, due to the miniaturisation of devices and to the reduction of the space available for performing this integration. Other constraints are also present, such as competition between wireless communication functions (frequency bands may be close, for some of these functions, and the modules for transmitting and receiving data may receive disturbances coming from other communications modules). For example, a payment terminal integrates numerous modules for reading payment cards: smart cards, stripe cards and contactless devices (cards, terminals of smartphone type).

Thus, for the reading of contactless payment cards, it is necessary that the payment terminal is equipped with a contactless communication antenna. Given the constraints of integration, compactness and ergonomy, the contactless antenna of the terminal is usually located at the housing of the printer or around the screen of the payment terminal. Moreover, in the context of a payment terminal, it is necessary that the payment transaction is carried out within a predetermined time span. It is therefore necessary that the contactless antenna enables a clear (that is to say the least possible interference) and fast reading of data coming from a contactless payment card. This is one of the main constraints that is the basis for the production of the contactless antenna and its integration within the payment terminal. Conversely, for a smartphone, the contactless antenna is generally located at the back of the terminal. The production and integration constraints at this location are the same as in the payment terminal.

Thus, in the case of a contactless communication system the antenna of which is located around the screen of the payment terminal, when the user desires to make a payment with the aid of their contactless card or their smartphone, they move it closer to the screen. The designers of payment terminals have indeed considered that the antenna necessary for the contactless payment (contactless antenna), should be placed opposite or close to the location where the user presents their payment means.

In addition, insofar as the mounting of a payment terminal is a complex operation, performed mainly by hand, the designers of terminals must take into account this aspect when they design a new terminal. The addition of a contactless antenna, which must necessarily be close to the external surface of the terminal (so that the radiation of the antenna is efficient), has therefore been performed as simply as possible both in terms of mounting and in terms of positioning.

For this, for the most recent terminals, the contactless antenna is produced in the form of a flexible printed circuit that goes around the screen. This method of designing the contactless antenna is advantageous from a certain point of view. Indeed, the mounting of this antenna is extremely simple. It is sufficient to position the antenna around the screen and connect the flexible circuit to a connector (CIF connector) previously soldered to the motherboard of the terminal.

However, this method of designing the contactless antenna raises an economic problem. Indeed, flexible printed circuits are invoiced during their manufacture depending on the total surface area occupied by the flexible printed circuit. In other words, as the contactless antenna goes around the screen, a substantial portion of the surface area of this flexible printed circuit is invoiced (the centre, which is empty) even though it is not used. It can be easily understood that when the size of a screen is for example 12 cm$^2$, the fact of having to pay for a flexible printed circuit for 12 cm$^2$ while only a small portion of this surface area is actually used in the manufacture of the terminal poses a substantial problem regarding the manufacturing cost of the terminal.

The European patent EP3107149 describes a solution to this problem. More particularly, a flexible printed circuit of longitudinal shape is described therein, comprising at least one conductive track extending along the length of the flexible printed circuit, the flexible printed circuit comprising at least one folding area shaped to allow said flexible printed circuit to pass from an unfolded state to a folded state wherein the conductive track forms at least one antenna loop. To function, this solution requires a soldering operation at the overlay areas of the printed circuit, when it is folded in order to form the antenna. Yet, such a soldering operation is on the one hand complex to perform and on the other hand expensive: it requires the implementation of a soldering operation (manual or automatic) and the use of solder-resistant materials (for the flexible printed circuit).

It is therefore necessary to have a solution for manufacturing and mounting an antenna that does not pose these problems of the prior art.

4. SUMMARY

The present disclosure makes it possible to solve at least some of the problems posed by the contactless communication antennas of the prior art. The present disclosure relates more particularly to a flexible printed circuit, comprising at least two conductive tracks extending along the length of the flexible printed circuit, flexible printed circuit wherein the conductive tracks form at least two antenna loops, said at least two conductive tracks being substantially parallel to one another.

According to the invention, such a flexible printed circuit comprises a contact zone located at a first end of the flexible printed circuit and configured to contact a predetermined portion of said flexible printed circuit, so that a first track of the flexible printed circuit is connected with a second track of the flexible printed circuit when the first end is placed in contact with the predetermined portion.

According to the invention, such a flexible printed circuit comprises at most two ends and in that at least one of these two is intended to be inserted into a connector.

Thus, it is possible thanks to the invention to not use soldering, as in the prior art, to solder two ends of the flexible printed circuit.

According to the invention, the predetermined portion consists of the second end of said printed circuit.

It is thus possible to make sure that the printed circuit tracks, when one covers the other at the ends, are used to materialise the turns of a multi-turn antenna.

According to the invention, the placing in contact of the first end with the second end is carried out during the connection of the two ends within a connector.

Thus, the implementation of the antenna is simple: its positioning and its insertion in the terminal are facilitated.

According to the invention, the flexible printed circuit comprises at least one folding area shaped to allow said flexible printed circuit to pass from an unfolded state to a folded state.

According to the invention, the contact zone comprises means for connecting said at least two conductive tracks to one another in order to form a predefined number of antenna loops.

According to the invention, the flexible printed circuit comprises at least one attachment hole of said flexible printed circuit on at least one antenna support.

Thus, it is possible to have an antenna that is simple and economical to produce, while making it possible to dispose it in a three-dimensional space rather than flat as that may be the case traditionally.

According to another aspect, the invention also relates to a device comprising wireless communication means implementing a transceiver and an antenna. According to a particular embodiment, said antenna comprises a flexible printed circuit such as previously described.

According to a particular embodiment, the device comprises a connector within which the two ends of the printed circuit are inserted so that the first end is placed in contact with the second end during the insertion of the two ends into said connector.

According to a particular embodiment, the connector is of top-bottom type.

5. DRAWINGS

Other features and advantages will become more apparent upon reading the following description of one particular embodiment of the disclosure, given by way of simple illustrative and non-limiting example, and the appended figures, wherein:

FIG. 4b illustrates an antenna comprising a double-sided flexible printed circuit such as described in FIG. 4a;

6. DISCLOSURE

As previously explained, the solution proposed consists of producing an antenna in a flexible printed circuit. To reduce the manufacturing costs in relation to prior-art antennas, also produced in a flexible printed circuit, a first feature of the technique proposed consists of designing a flexible printed circuit comprising at least two antenna tracks. According to the invention, taken individually, each track of the printed circuit constitutes an antenna loop. Unlike the prior art, particularly that of the European patent EP3107149, the tracks of the flexible printed circuit of the invention are connected to one another to form a multi-turn antenna during the insertion of one end at least of the printed circuit into an appropriate connector. As explained hereafter in connection with a plurality of embodiments, the flexible printed circuit and the connector are adapted so that the antenna loops are effectively formed by the connection of the printed circuit in the connector. More particularly, the connector may be a standard commercial connector skillfully used to cause, during the connection of the printed circuit in the connector, the creation of turns of the antenna.

Figure 1A:
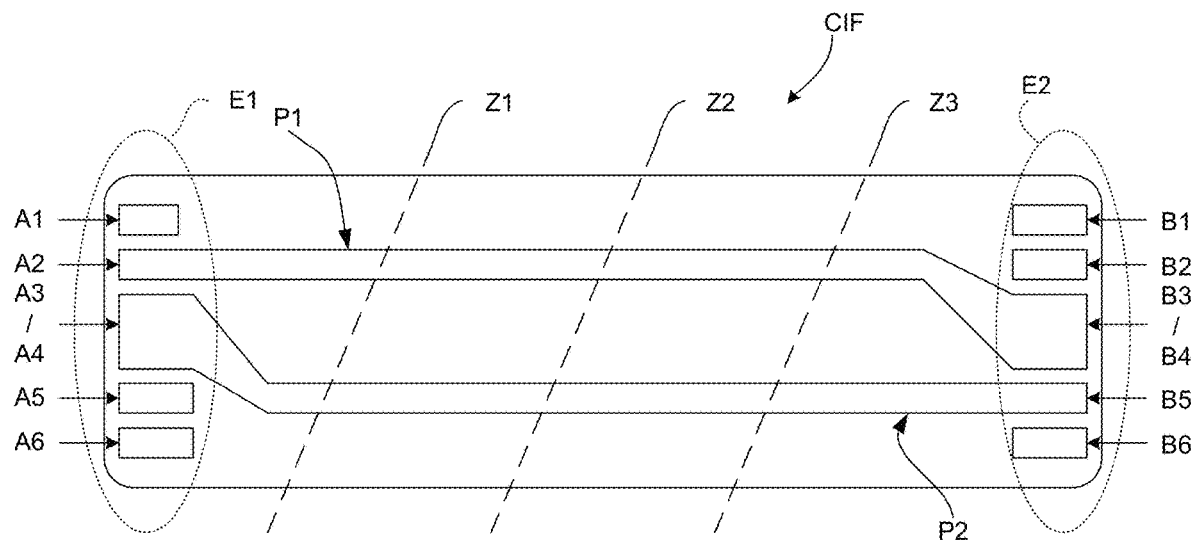
FIG. 1a illustrates the general principle of the flexible printed circuit of the invention.

FIG. 1a explains the general principle of the invention. As indicated in this schematic diagram, two printed circuit tracks (P1, P2) are formed on the flexible printed circuit (CIF) of the invention. These two tracks are independent from one another and substantially parallel. At least one end (E1, E2), the flexible printed circuit (CIF) is shaped so that the electrical tracks that are inscribed therein are connected during the insertion of the flexible printed circuit into the appropriate connector (CNC, FIG. 1b, FIG. 1c). More particularly, in the example of FIG. 1A, the antenna consists of two turns, the two turns being materialised during the insertion of the two ends (E1, E2) of the flexible printed circuit (CIF) into the same connector, at the contact zones A3/A4 and B3/B4. The flexible printed circuit (CIF) is curved on itself (by means of foldings, in particular among folding areas Z1, Z2, Z3), in order to conform to an expected volume within which it must be placed to play the role of antenna. Once this folding has been performed, the two ends of the flexible printed circuit are inserted at the same time into the connector (CNC).

Figure 1B:
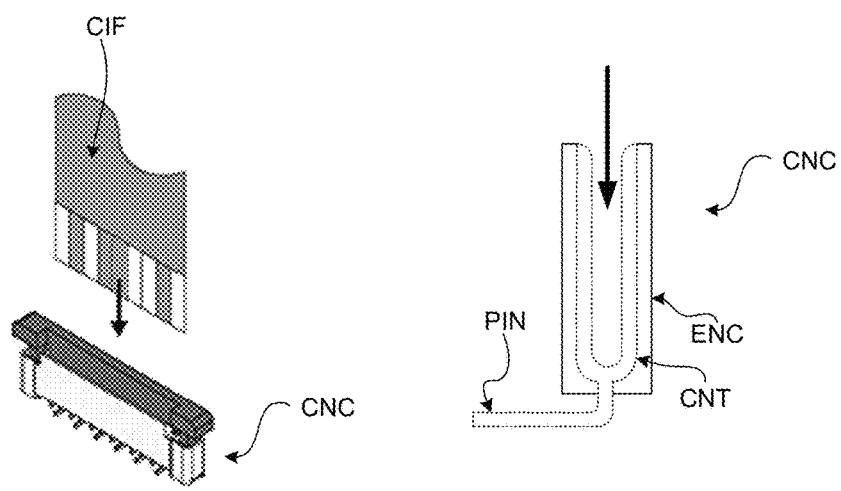
FIG. 1b illustrates a connector intended to receive the flexible printed circuit.
Figure 1C:
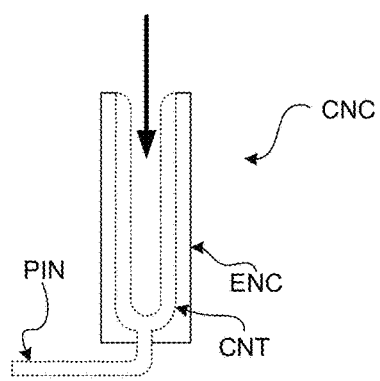
FIG. 1c illustrates a cross-section of connector intended to enable the contact of two ends

FIG. 1b illustrates the connector (CNC) wherein the flexible printed circuit (CIF) of FIG. 1a is placed. The connector CNC is itself secured with a printed circuit (for example a motherboard, not shown). In this embodiment, only the pins number 2 and 5 of the connector (CNC) are effectively connected by circuit to a signal transceiver component. The other pins of the connector are not used (other than to ensure the attachment of the connector on the printed circuit (the motherboard)). FIG. 1c shows a section of the connector (CNC). It comprises an enclosure (ENC), generally made of plastic and a plurality of metal blades (only one shown in dotted lines on this section), the metal blade comprising a connection portion (CNT) and an attachment pin (PIN) intended to be attached. In this embodiment, the connection portion is double (left/right in the figure) thus ensuring a connection between the contact zones A3/A4 and B3/B4.

Thus, in summary, the invention consists of a flexible printed circuit the tracks of which form an antenna when they are connected within a connector, the connector being selected to enable a contact between two different tracks of the flexible printed circuit. According to the invention, the flexible printed circuit, for its part, has at least one track (from all of the tracks having for function an antenna turn) the width of which, at the end, occupies at least two locations within the connector.

According to the invention, one connector having at least one contact more than the number of turns to be produced is sufficient to enable a loop offset (for example three contacts for two turns, as previously disclosed, four contacts for three turns, etc.). However, in the interest of economic efficiency, commercial connectors are used. These generally comprise an even number of connection pins and these connectors are preferred for an operational implementation.

Figure 2A:
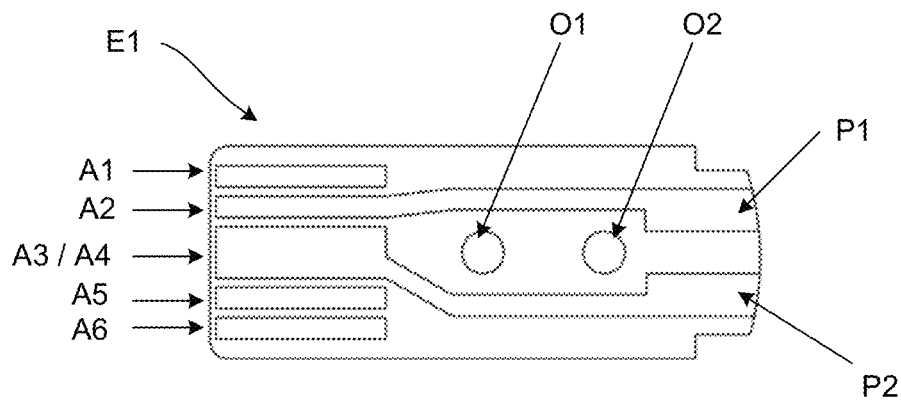
FIG. 2a illustrates one embodiment of a first end of the flexible printed circuit.
Figure 2B:
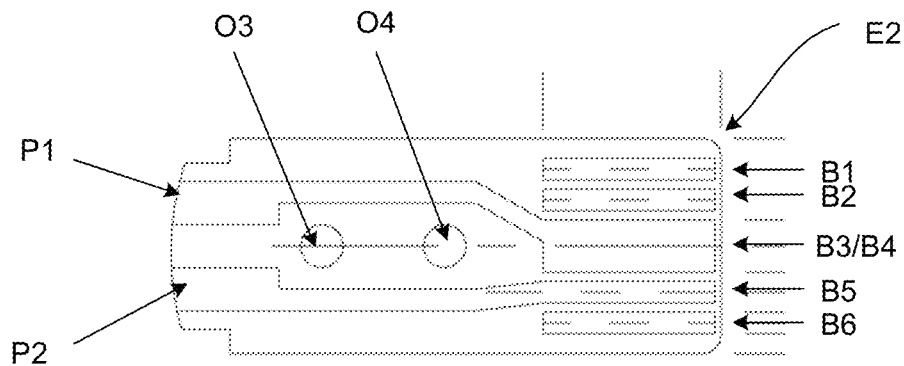
FIG. 2b illustrates one embodiment of a second end of the flexible printed circuit.
Figure 2C:
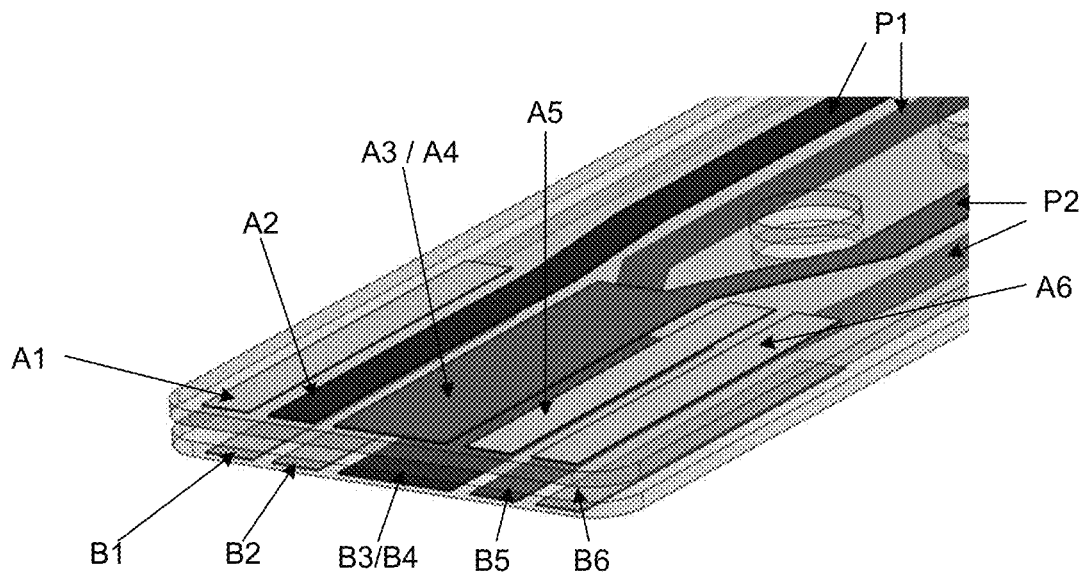
FIG. 2c is a three-dimensional view of the joint made between the two ends of the flexible printed circuit of FIGS. 2a and 2b.

In a first embodiment, described in relation to FIGS. 2a, 2b and 2c, the flexible printed circuit of the invention comprises two ends, each of these ends comprising printed circuit tracks as illustrated in FIG. 2a and 2b. In this example, a top-down connector with six contacts is used. FIG. 2a shows a first end (noted E1) of a flexible printed circuit. FIG. 2b shows the second end of the flexible printed circuit of the invention (noted E2).

In FIG. 2a, the contact zones A1, A2 and A6 are not used. The contact zones A3 and A4 are joints: the contact range makes it possible to associate the track P1, which relates to the first turn, with the contact zones A3 and A4 of the connector. The track P2 (relating to the second turn), for its part, is associated with the contact A5 only.

In FIG. 2b, the contact zones B1, B5 and B6 are not used. The contact zones B3 and B4 are joints: the contact range makes it possible to associate the track P2, which relates to the second turn, at the contact zones B3 and B4 of the connector. The track P1 (relating to the first turn), for its part, is associated with the contact B2 only. Holes (O1, O2, O3, O4) distributed over the entire flexible printed circuit, make it possible to attach and/or adjust the flexible printed circuit on gripping areas intended for this gripping function, for example during the mounting of the flexible printed circuit on the portable device.

In FIG. 2c, a three-dimensional representation with the two ends (E1, E2) joined, and ready to be inserted into a connector. It is noted by means of this FIG. 2c, that according to the invention:

the contact zones A1 and B1 are not used;
the contact zones A6 and B6 are not used;
the contact zone A5 is used for the first track (P1), which forms a first turn (S1), the first track ending with a double contact zone (B3, B4);
the contact zones A3 and A4 are used jointly by a track (P2) starting with a double contact and forming the second turn (S2), the second track (P2) ending at the second end at the contact zone B5;
the contact zone A5 is not used.

Thus, it is noted that the change of turn, in this embodiment, is performed at the contact zones A3-A4 and B3-B4. The antenna in a way "starts" at the contact zone A2, the first turn finishes at the contact zones B3-B4. A joint is produced, by the contacts of the connectors (at the corresponding contacts of the connector) to connect the contact zones B3-B4 with the contact zones A3-A4. The second turn starts at A3-A4 and ends at B5. The double turn antenna starts at A2 and ends at B5.

The advantages provided by this solution are numerous. Firstly, the implementation of the antenna does not require any soldering. The antenna may comprise folding areas in order to conform it to the volume wherein it must be placed. These possible folding operations may be manual or automatic depending on embodiments. The manufacturing cost of the antenna is therefore reduced a first time. Secondly, as the antenna does not require soldering, it is possible to use a flexible material of lower resistance (it does not need to be solder-resistant). This material is therefore less expensive and makes it possible to achieve a second saving. More particularly, it is not necessary to used PI material (material commonly named thus to refer to "Flame-resistant polyimide (PI) film") and it is possible to make do with a single-layer flexible printed circuit. Thirdly, the antenna may be implemented easily by making do with plugging the ends into the connector.

Figure 3:
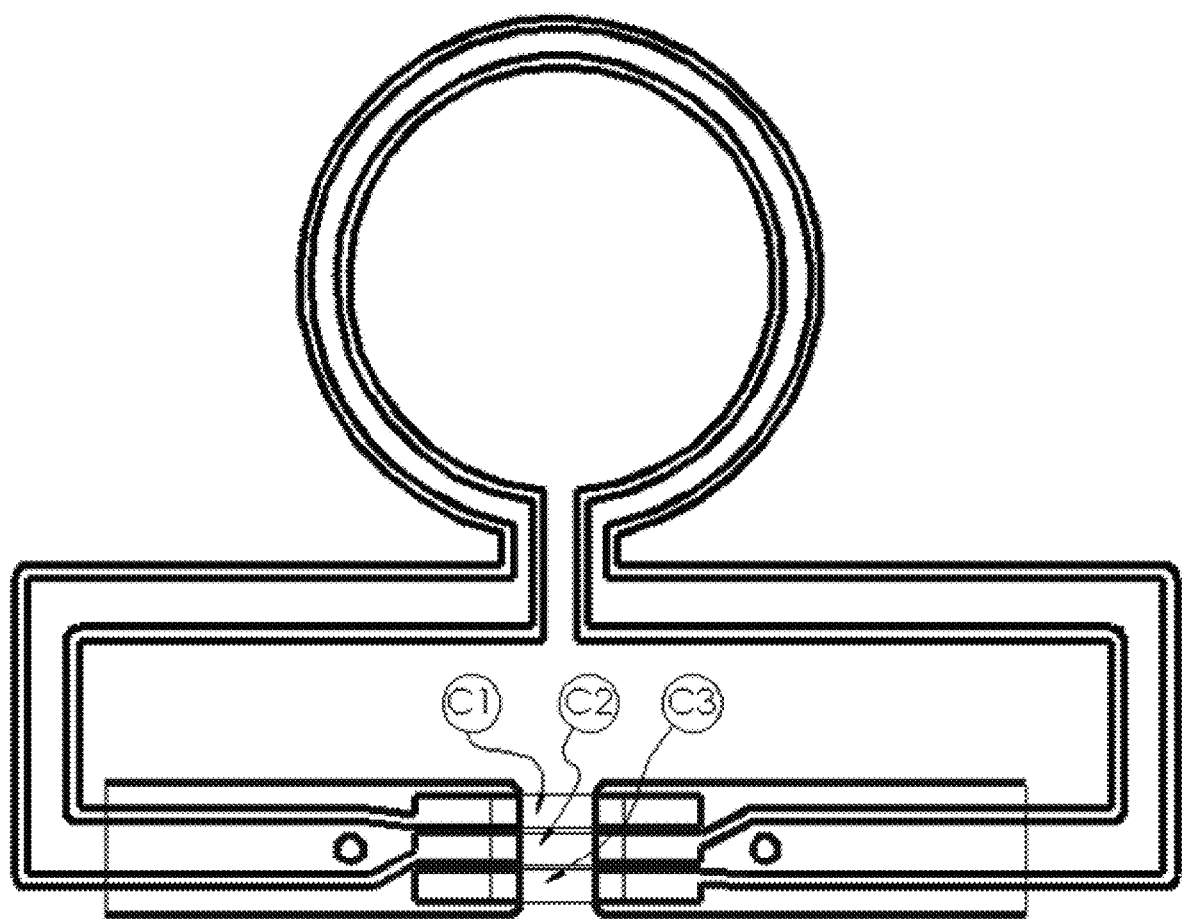
FIG. 3 illustrates another embodiment of a flexible printed circuit.

FIG. 3 discloses a second embodiment of the antenna according to the invention, by applying the same principle as that previously described. This again concerns an antenna having two tracks forming two turns. In this embodiment, the antenna is preformed (it is not formed by folding as in the first embodiment of FIG. 1a). It comprises, at its two ends, respectively two times three connection ranges. The antenna starts at C1 and ends at C3 with a connection made at C2, when the two ends of the printed circuit are inserted into the appropriate connector. This solution is sub-optimal insofar as the flexible printed circuit is not straight, and therefore that this configuration generates loss of material since the cutting of the antenna requires throwing away a significant portion of the flexible circuit, whereas this portion is subject to invoicing.

Figure 4A:
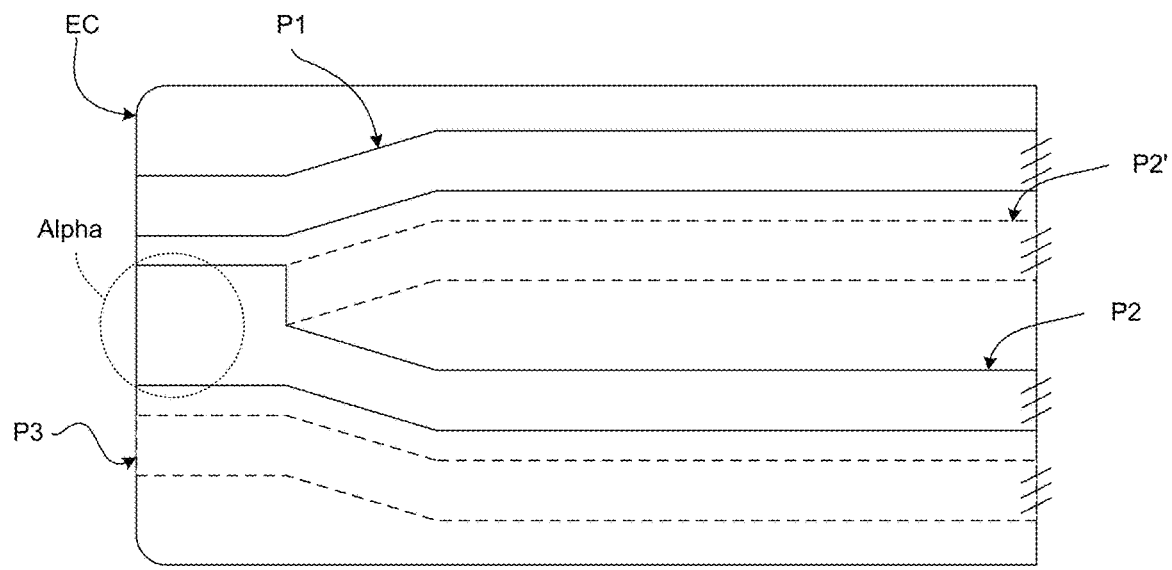
FIG. 4a illustrates another embodiment of a flexible printed circuit, wherein the printed circuit tracks are inscribed on both flexible printed circuit sides.
Figure 4B:
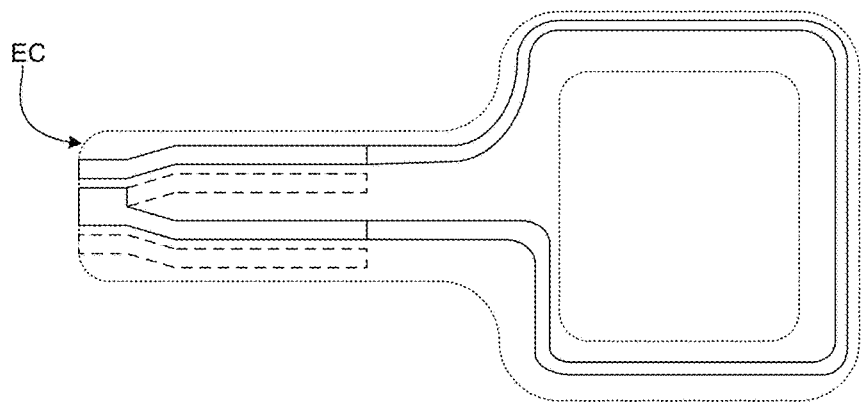
Figure 4C:
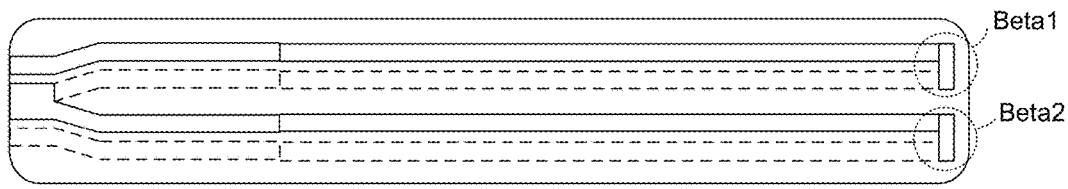
FIG. 4c illustrates an antenna comprising a double-sided flexible printed circuit such as described in FIG. 4a in another embodiment.

In another embodiment, the general principle of the invention is implemented on a flexible printed circuit comprising tracks printed on both sides of the flexible printed circuit. Thus, only one end of the flexible printed circuit is inserted into the connector. An example of embodiment of an antenna according to the invention is presented in FIGS. 4a, 4b and 4c. The black lines (--) correspond to the tracks of the top side of the flexible printed circuit while the dotted lines (- -) correspond to the tracks of the bottom side of the flexible printed circuit. FIG. 4a illustrates the connection end (EC). This connection end (EC) comprises, on the top side two tracks (P1, P2) and on the bottom side also two tracks (P2' and P3). The joint between the two turns of the antenna is produced at the Alpha join point, when the connection end is inserted into the connector. FIG. 4b illustrates this connection end (EC) as implementable on a pre-formed antenna on a flexible printed circuit. In this example, it is noted that the tracks (P1 and P2) in reality constitute one and the same track that goes around the periphery of the antenna. The same applies for P2' and P3 (the path around the periphery, on the bottom side of the antenna is not shown). FIG. 4c illustrates this connection end (EC) as implementable on a longitudinal flexible printed circuit, having, as in FIG. 1a, the additional advantage of making it possible to create a flexible printed circuit without loss of material, that can be folded in order to form the turns. In this example, connection joints (Beta1, Beta2) are produced at the second end of the flexible printed circuit. The connection joints (Beta1, Beta2) are shaped to make it possible for the electrical signal to pass through the layer or layers of the flexible printed circuit (an electrical signal transmission continuity is thus achieved). As for the other longitudinal embodiments, the antenna is first folded, at the predetermined folding areas, in order to conform it to the volume wherein it must be placed, then the connection end EC is inserted into the connector.

In yet another embodiment, as for the preceding, only one end is plugged into the connector. Unlike the preceding, however, the set of tracks of the printed circuit is plotted on the same side of the flexible printed circuit. The other end is glued or associated (placed in contact) on a predetermined portion of the printed circuit and a connection between the turns is produced at this predetermined portion, rather than at the two ends. This way of doing things somewhat modifies the way in which the tracks of the flexible printed circuit are plotted. However, the principle still consists of defining particular contact zones intended to join the tracks during the assembly (or the folding of the antenna).

Generally, the invention is usually implemented by defining a flexible printed circuit lengthwise in an unfolded position of the antenna. Thus, rather than having to hollow out a flexible circuit (and therefore pay for the hollowed-out, central, portion, FIGS. 3 and 4b), the antenna-forming flexible circuit is plotted lengthwise and then folded beforehand or at the same time as the antenna is mounted. The folding, according to the present technique may be a flat folding, as previously disclosed or an intermediate folding, which may then be considered as a deformation rather than a real folding. Thus an antenna is obtained, the features of which are the same as with a "hollowed-out" flexible printed circuit, but with a much lower production cost, precisely because it is not necessary to pay for the hollowed-out part of the flexible circuit. Moreover, the wastage related to the manufacture of the antenna is also deducted. Thus, this simple example makes it possible to solve the problems related to the manufacture of an antenna that must be positioned on the rim of a screen.

Although the present disclosure has been described with reference to one or more examples, workers skilled in the art will recognize that changes may be made in form and detail without departing from the scope of the disclosure and/or the appended claims.

The invention claimed is:

1. A flexible printed circuit, comprising:
   at least two conductive tracks, including a first track and a second track, extending along a length of the flexible printed circuit, said at least two conductive tracks being substantially parallel to one another;
   at most two ends, including a first end and a second end, which are shaped to be inserted into a same connector; and
   a contact zone located at the first end of the flexible printed circuit and positioned to contact a predetermined portion of said flexible printed circuit, so that the first track of the flexible printed circuit is connected with the second track of the flexible printed circuit to form at least two antenna loops, when the first and second ends are inserted into the same connector.

2. The flexible printed circuit according to claim 1, wherein the predetermined portion comprises the second end of said flexible printed circuit.

3. The flexible printed circuit according to claim 2, wherein the placing in contact of the first end with the second end is carried out during the connection of the first and second ends within a connector.

4. The flexible printed circuit according to claim 1, which comprises at least one folding area shaped to allow said flexible printed circuit to pass from an unfolded state to a folded state.

5. The flexible printed circuit according to claim 1, wherein the contact zone comprises means for connecting said at least two conductive tracks to one another in order to form a predefined number of antenna loops.

6. The flexible printed circuit according to claim 1, which comprises at least one attachment hole to attach said flexible printed circuit on at least one antenna support.

7. A device comprising:
   a wireless communication circuit comprising a transceiver and an antenna, wherein said antenna comprises a flexible printed circuit comprising:
   at least two conductive tracks, including a first track and a second track, extending along a length of the flexible printed circuit, said at least two conductive tracks being substantially parallel to one another;
   at most two ends, including a first end and a second end, which are shaped to be inserted into a same connector; and
   a contact zone located at the first end of the flexible printed circuit and positioned to contact a predetermined portion of said flexible printed circuit, so that the first track of the flexible printed circuit is connected with the second track of the flexible printed circuit to form at least two antenna loops, when the first and second ends are inserted into the same connector.

8. The device according to claim 7, which comprises a connector within which the first and second ends of the flexible printed circuit are inserted so that the first end is placed in contact with the second end during the insertion of the first and second ends into said connector.

9. The device according to claim 8, wherein the connector is of a top-bottom type.

10. The device according to claim 7, wherein the predetermined portion comprises the second end of said flexible printed circuit.

11. The device according to claim 10, wherein the placing in contact of the first end with the second end is carried out during the connection of the first and second ends within a connector.

12. The device according to claim 7, wherein the flexible printed circuit comprises at least one folding area shaped to allow said flexible printed circuit to pass from an unfolded state to a folded state.

13. The device according to claim 7, wherein the contact zone comprises means for connecting said at least two conductive tracks to one another in order to form a predefined number of antenna loops.

14. The device according to claim 7, which comprises at least one attachment hole to attach said flexible printed circuit on at least one antenna support.

15. A method comprising:
  providing a flexible printed circuit comprising:
    at least two conductive tracks, including a first track and a second track, extending along a length of the flexible printed circuit, said at least two conductive tracks being substantially parallel to one another;
    at most two ends, including a first end and a second end, which are shaped to be inserted into a same connector; and
    a contact zone located at the first end of the flexible printed circuit and positioned to contact a predetermined portion of said flexible printed circuit, when the first and second ends are inserted into the same connector; and
  inserting the first end and the second end into the same connector so that the contact zone located at the first end of the flexible printed circuit contacts the predetermined portion of said flexible printed circuit and the first track of the flexible printed circuit is connected with the second track of the flexible printed circuit to form at least two antenna loops.

16. The method of claim 15 comprising performing the inserting so as to make an electrical connection between the first end of the flexible printed circuit and the predetermined portion of the flexible printed circuit without soldering.

\* \* \* \* \*